(12) United States Patent
Takeuchi et al.

(10) Patent No.: US 8,106,984 B2
(45) Date of Patent: Jan. 31, 2012

(54) IMAGE CAPTURING APPARATUS AND ELECTRONIC INFORMATION DEVICE

(75) Inventors: Noboru Takeuchi, Mie (JP); Kazuo Ohtsubo, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 444 days.

(21) Appl. No.: 12/379,562

(22) Filed: Feb. 25, 2009

(65) Prior Publication Data

US 2009/0219422 A1 Sep. 3, 2009

(30) Foreign Application Priority Data

Mar. 3, 2008 (JP) ................................. 2008-052728

(51) Int. Cl.
*H04N 5/335* (2011.01)
*H01L 27/00* (2006.01)
(52) U.S. Cl. ....................... 348/308; 348/300; 250/208.1
(58) Field of Classification Search ............... 250/208.1; 257/290, 291; 348/300, 301, 308
See application file for complete search history.

(56) References Cited

U.S. PATENT DOCUMENTS

| 6,437,635 | B1 * | 8/2002 | Watanabe | 327/514 |
| 7,502,060 | B2 * | 3/2009 | Watanabe | 348/300 |
| 2011/0181749 | A1 * | 7/2011 | Yamada | 348/222.1 |

FOREIGN PATENT DOCUMENTS

| JP | 2003032554 A | * | 1/2003 |
| JP | 2006237462 A | * | 9/2006 |
| JP | 2006-313899 | | 11/2006 |
| JP | 2007243197 A | * | 9/2007 |
| JP | 2008186894 A | * | 8/2008 |
| WO | WO 2006/046385 A1 | * | 5/2006 |

OTHER PUBLICATIONS (English Translation) Original Claims for JP2008-052728, Mar. 3, 2010.*
(English Translation) JPO Reasons for Refusal for JP2008-052728, Jul. 26, 2010.*
(English Translation) JPO Written Argument for JP2008-052728, Sep. 24, 2010.*
(English Translation) JPO Written Amendment for JP2008-052728, Sep. 24, 2010.*

* cited by examiner

*Primary Examiner* — David N Spector
(74) *Attorney, Agent, or Firm* — David G. Conlin; Steven M. Jensen; Edwards Wildman Palmer LLP

(57) ABSTRACT

A solid-state image capturing apparatus includes a pixel array in which a plurality of pixels are arranged in a matrix, where each of the pixels includes: a photodiode for obtaining a signal charge by a photoelectric conversion of an incident light; and an amplifying transistor for the signal charge obtained at the photodiode, and where the amplifying transistor is configured in such a manner that a gate area of the amplifying transistor is defined to be larger than a gate area of other transistors that configure the pixel.

10 Claims, 8 Drawing Sheets

(a)

(b)

(a)

(b)

(a)

(b)

(a)

(b)

IMAGE CAPTURING APPARATUS AND ELECTRONIC INFORMATION DEVICE

This nonprovisional application claims priority under 35 U.S.C. §119(a) to Patent Application No. 2008-052728 filed in Japan on Mar. 3, 2008, the entire contents of which are hereby incorporated by reference.

BACKGROUND OF THE INVENTION

1. Field of the Invention

The present invention relates to a solid-state image capturing apparatus and an electronic information device, and more particularly to a solid-state image capturing apparatus, such as a CMOS image sensor, configured with semiconductor elements, for performing a photoelectric conversion on and capturing an image light from a subject; and an electronic information device including the solid-state image capturing apparatus as an image input device used in an image capturing section thereof.

2. Description of the Related Art

Recently, a CMOS image sensor can be produced by a semiconductor forming process, which is a general CMOS process, and therefore, attention is riveted to such a CMOS image sensor as a solid-state image capturing apparatus that can be provided at a low price. However, there is a problem of noise even with such a CMOS image sensor.

Regarding the noise, there exists a fixed noise, which occurs always at the same pixel (at the same position on a screen) regardless of a photographing timing, and random noise (Random Telegraph Signal Noise), which occurs at a different pixel (at a different position on a screen) depending on a photographing timing.

Such random noise is a result of crystal defect that exists at a readout path of a signal charge and an interface level, and particularly is caused when an electric charge is captured at a silicon/gate insulation film interface of a source follower transistor. Therefore the random noise decides a noise level of a recent solid-state image capturing apparatus in which a pixel size is reduced to several times the size of a wavelength of light.

The reduction of the random noise is especially requested currently in order to obtain a fine and highly sensitive image without the presence of noise under a condition of low luminous intensity. For example, Reference 1 discloses a technique to reduce the random noise.

Reference 1 describes a technique where a gate insulation film of a transistor inside a pixel that configure a solid-state image capturing apparatus is formed such that at least a portion near a silicon interface is composed of an oxide that does not include nitrogen so that misfitting of a crystal lattice derived from nitrogen atoms is eliminated, thereby reducing the defect level density of the silicon/gate insulation film interface to control the occurrence of the random noise.

Reference 1: Japanese Laid-Open Publication No. 2006-313899

SUMMARY OF THE INVENTION

The defect level density of the silicon/gate insulation film interface is determined by various factors and influences during the semiconductor forming process. For example, such a defect level is determined by a complex accumulation of various factors and influences of a thermal oxidation condition of a gate insulation film and an anneal condition thereafter, a channel concentration and its profile forming method, hydrogen sinter condition, and further, a process damage of various plasmas and ultraviolet rays and the like. Because of this, the defect level density does not change in some cases depending on the semiconductor forming process to be used even if nitrogen atoms are removed from the gate insulation film, resulting in no significant effect to control the random noise.

Further, when a gate insulation film of a transistor is formed such that at least a portion near a silicon interface is composed of an oxide that does not include nitrogen, as described above, it is indicated that it requires the film quality of the gate insulation film to be changed. Therefore, it is feared that various characteristics, including a reliability of device, may change, and therefore the degree of difficulty of a change process is high.

The present invention is intended to solve the conventional problems described above. The objective of the present invention is to provide a solid-state image capturing apparatus capable of reducing the influence of random noise by a simple change of the layout pattern, without depending on a semiconductor forming process to be used; and an electronic information device using the solid-state image capturing apparatus.

A solid-state image capturing apparatus according to the present invention includes a pixel array in which a plurality of pixels are arranged in a matrix, where each of the pixels includes: a photodiode for obtaining a signal charge by a photoelectric conversion of an incident light; and an amplifying transistor for amplifying the signal charge obtained at the photodiode, and where the amplifying transistor is configured in such a manner that a gate area of the amplifying transistor is defined to be larger than a gate area of other transistors that configure the pixel, thereby achieving the objective described above.

Preferably, in a solid-state image capturing apparatus according to the present invention, the pixel includes a transfer transistor for transferring the signal charge obtained at the photodiode to a gate electrode of the amplifying transistor, and the amplifying transistor is configured in such a manner that a gate area of the amplifying transistor is defined to be larger than a gate area of other transistors that configure the pixel, with the exception of the transfer transistor.

Still preferably, in a solid-state image capturing apparatus according to the present invention, the pixel includes a reset transistor for discharging the signal charge obtained at the photodiode.

Still preferably, in a solid-state image capturing apparatus according to the present invention, a plurality of adjacent pixels share the reset transistor.

Still preferably, in a solid-state image capturing apparatus according to the present invention, the pixel includes a selection transistor for selecting a pixel that the selection transistor configures from a plurality of pixels that configure the pixel array.

Still preferably, in a solid-state image capturing apparatus according to the present invention, a plurality of adjacent pixels share the selection transistor and a specific pixel is selected from the plurality of adjacent pixels by the selection transistor and the transfer transistor of each pixel.

Still preferably, in a solid-state image capturing apparatus according to the present invention, the pixel includes a reset transistor for discharging the signal charge obtained at the photodiode and a selection transistor for selecting a pixel that the selection transistor configures from a plurality of pixels that configure the pixel array; and a gate area of the reset transistor is equal to a gate area of the selection transistor.

Still preferably, in a solid-state image capturing apparatus according to the present invention, a plurality of adjacent pixels share at least one of the reset transistor and the selection transistor.

Still preferably, in a solid-state image capturing apparatus according to the present invention, the pixel is a pixel of a 4 transistor configuration that includes the amplifying transistor, the transfer transistor, the reset transistor and the selection transistor.

Still preferably, in a solid-state image capturing apparatus according to the present invention, the pixel array is configured in such a manner that two adjacent pixels share the reset transistor and the selection transistor.

Still preferably, in a solid-state image capturing apparatus according to the present invention, the pixel is a pixel of a 3 transistor configuration that includes the amplifying transistor, the transfer transistor and the reset transistor.

Still preferably, in a solid-state image capturing apparatus according to the present invention, the pixel array is configured in such a manner that two adjacent pixels share the reset transistor.

Still preferably, in a solid-state image capturing apparatus according to the present invention, the pixel includes a reset transistor for discharging the signal charge obtained at the photodiode and a selection transistor for selecting a pixel that the selection transistor configures from a plurality of pixels that configure the pixel array, and a gate area of the reset transistor is equal to a gate area of the selection transistor.

Still preferably, in a solid-state image capturing apparatus according to the present invention, the pixel is a pixel of a 3 transistor configuration that includes the amplifying transistor, the reset transistor and the selection transistor.

Still preferably, in a solid-state image capturing apparatus according to the present invention, the amplifying transistor is a source follower transistor that operates as a source follower circuit.

Still preferably, in a solid-state image capturing apparatus according to the present invention, a gate area of the source follower transistor is 135% or more of a gate area of other transistors that configure the pixel with the exception of the transfer transistor.

Still preferably, in a solid-state image capturing apparatus according to the present invention, a channel length of the source follower transistor is 135% or more of a maximum channel length of other transistors that configure the pixel with the exception of the transfer transistor.

Still preferably, in a solid-state image capturing apparatus according to the present invention, the source follower transistor is a second conductive type MOS field-effect transistor that includes a gate electrode that is configured of a first conductive type semiconductor.

Still preferably, in a solid-state image capturing apparatus according to the present invention, the source follower transistor is a first conductive type MOS field-effect transistor that includes a gate electrode that is configured of a first conductive type semiconductor.

An electronic information device according to the present invention includes an image capturing section for capturing an image of a subject, wherein the image capturing section is the solid-state image capturing apparatus according to the present invention, thereby achieving the objective described above.

The functions of the present invention will be described hereinafter.

According to the present invention, in a solid-state image capturing apparatus including a pixel array in which a plurality of pixels are arranged in a matrix, where each of the pixels includes: a photodiode for obtaining a signal charge by a photoelectric conversion of an incident light; and an amplifying transistor for amplifying the signal charge obtained at the photodiode, and where the amplifying transistor is configured in such a manner that a gate area of the amplifying transistor is defined to be larger than a gate area of other transistors that configure the pixel, thereby reducing the influence of random noise by a simple change of the layout pattern, without depending on a semiconductor forming process to be used.

According to the present invention, a plurality of adjacent pixels in the solid-state image capturing apparatus described above has a circuit configuration such that they share at least either of the reset transistor or the selection transistor, thereby reducing the area utilized by the pixels.

According to the present invention, the gate area of the source follower transistor in the solid-state image capturing apparatus described above is defined to be 135% or more of the gate area of other transistors, except for the transfer transistor, that configure the pixel, so that the random noise can be reduced by half, thereby achieving a substantial noise reduction.

According to the present invention, the channel length of the source follower transistor in the solid-state image capturing apparatus described above is defined to be 135% or more of a maximum channel length of the other transistors, except for the transfer transistor, that configures the pixel, so that the random noise can be reduced to less than half.

According to the present invention, the source follower transistor in the solid-state image capturing apparatus described above is defined to be a second conductive MOS field-effect transistor that includes a gate electrode configured of a first conductive semiconductor, so that an energy structure is formed where an electric charge is difficult to capture at a silicon/gate insulation film interface, thereby further reducing the random noise.

According to the present invention, the source follower transistor in the solid-state image capturing apparatus described above is defined to be a first conductive MOS field-effect transistor that includes a gate electrode configured of a first conductive semiconductor, so that a complete embedded channel structure can be formed, thereby still further reducing the random noise.

As described above, according to the present invention, a solid-state image capturing apparatus includes a pixel array in which a plurality of pixels are arranged in a matrix, where each of the pixels includes: a photodiode for obtaining a signal charge by a photoelectric conversion of an incident light; and an amplifying transistor for amplifying the signal charge obtained at the photodiode, and where the amplifying transistor is configured in such a manner that a gate area of the amplifying transistor is defined to be larger than a gate area of other transistors that configure the pixel, thereby producing the effect of reducing the influence of random noise by a simple change of the layout pattern, without depending on a semiconductor forming process to be used.

These and other advantages of the present invention will become apparent to those skilled in the art upon reading and understanding the following detailed description with reference to the accompanying figures.

BRIEF DESCRIPTION OF THE DRAWINGS

FIG. 1(a) illustrates the diagrammatic structure and FIG. 1(b) illustrates a circuit structure of the pixel.

FIG. 2(a) illustrates the plan view layout and FIG. 2(b) illustrates a cross sectional structure along a line A-A in FIG. 2(a).

FIG. 3(a) illustrates a relationship between a gate area (channel area) S of a source follower transistor and random noise Nrd with a graph. FIG. 3(b) illustrates a relationship between a gate area (channel area) S of a source follower transistor and an S/N ratio Rsn with a graph.

FIG. 5(a) illustrates a circuit configuration of the pixel. FIG. 5(b) is a diagram illustrating a plan view layout of a pixel circuit of a 4TR configuration in which two pixels share a portion of transistors in a pixel.

Figure 1:
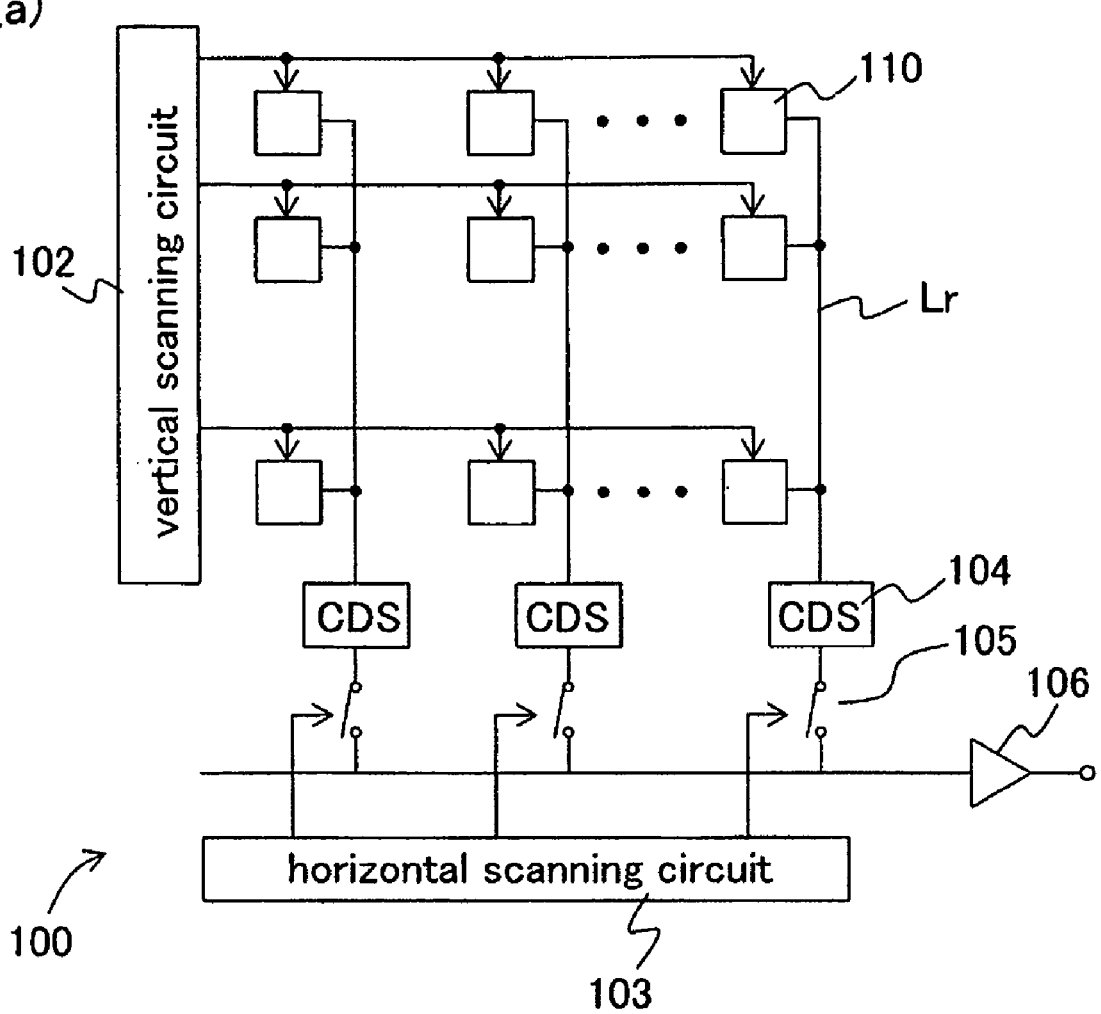
FIG. 1 is a diagram illustrating a CMOS image sensor as a solid-state image capturing apparatus according to Embodiment 1 of the present invention.
Figure 1:
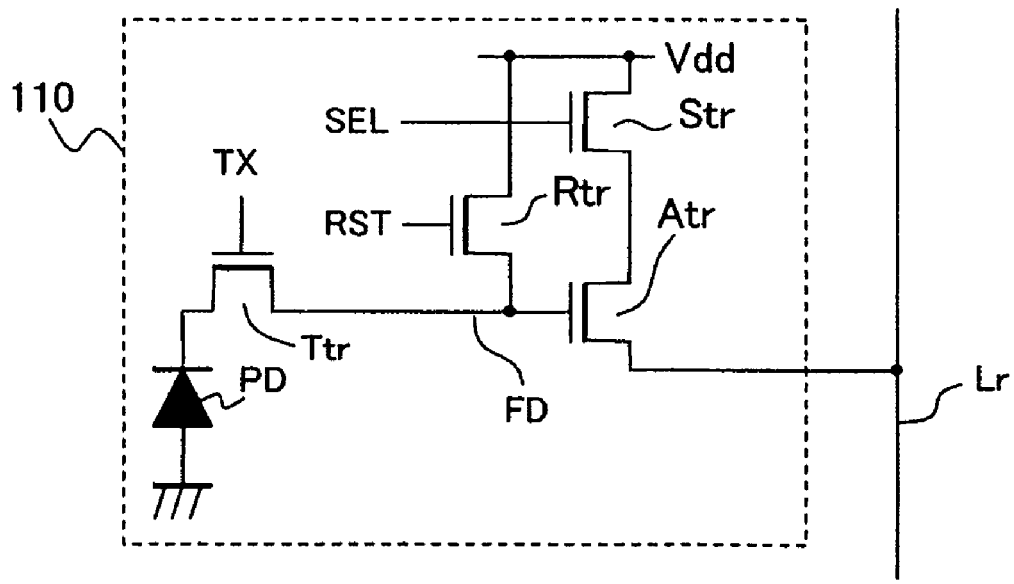

1 p-type semiconductor substrate
11 n⁻ type diffusion area
11c, 11c1, 11c2 side edge inclined portion
12 belt shaped diffusion area
13 p-type diffusion area
13a gate insulation film
20 belt shaped n⁻ type diffusion area
20a gate insulation film
100 solid-state image capturing apparatus
102 vertical scanning circuit
103 horizontal scanning circuit
104 CDS circuit
105 selection switch
106 output section
110, 111, 112 pixel
110a pixel circuit
Atr amplifying transistor
Lr readout signal line
PD, PD1, PD2 photodiode
Rtr reset transistor
Str selection transistor
Tg transfer gate electrode
Ttr transfer transistor

DESCRIPTION OF THE PREFERRED EMBODIMENTS

Hereinafter, embodiments of the present invention will be described with reference to the accompanying figures.

Embodiment 1

FIG. 1 is a diagram illustrating a CMOS image sensor as a solid-state image capturing apparatus according to Embodiment 1 of the present invention. FIG. 1(a) illustrates the diagrammatic structure and FIG. 1(b) illustrates a circuit structure of the pixel.

As illustrated in FIG. 1(a), a solid-state image capturing apparatus (CMOS image sensor) 100 illustrated in FIG. 1 includes: a plurality of pixels 110 arranged in a matrix; a readout signal line Lr provided in a corresponding manner to each pixel column, for reading out a reset voltage and a photoelectric conversion voltage generated at a pixel; a CDS circuit 104 connected to each readout signal line Lr; and an output section 106 for outputting an output signal of the CDS circuit 104 as a pixel signal. Further, the CMOS image sensor 100 includes: a vertical scanning circuit 102 for selecting one of a plurality of pixel rows; and a horizontal scanning circuit 103 for selecting one of a plurality of CDS circuits 104. Herein, the CDS circuit 104 is a correlated double sampling circuit for sampling both a reset voltage and a photoelectric conversion voltage that are read out from a pixel to the readout signal line Lr to take the difference of them, and is to remove noise from a pixel signal to be read out from a pixel. In addition, a selection switch 105 is connected between an output of each CDS circuit 104 and an input of the output section 106, the selection switch 105 being operated by a scanning signal from the horizontal scanning circuit 103.

Herein, each pixel 110 is configured of a pixel circuit of a four transistor configuration, as illustrated in FIG. 1(b). That is, each pixel 110 includes: a photodiode PD for performing a photoelectric conversion; an amplifying transistor Atr for amplifying a signal charge generated at the photodiode PD to generate a signal voltage; a transfer transistor Ttr connected between the photodiode PD and an gate electrode of the amplifying transistor Atr, for transferring a signal charge obtained at the photodiode PD to the gate electrode of the amplifying transistor Atr by a transferring signal TX. Further the pixel 110 includes: a reset transistor Rtr connected between a gate of the amplifying transistor and a power source line vdd, for discharging a signal charge accumulated at the gate electrode of the transfer transistor Ttr by a reset signal RST; and a selection transistor Str connected between a drain of the amplifying transistor and the power source line vdd, for allowing a pixel to be in a selectable state by applying a power source voltage to the amplifying transistor by a selection signal SEL. In addition, the amplifying transistor Atr is a source follower transistor that configures a source follower circuit that changes an output voltage in accordance with an input voltage at a constant voltage gain.

Figure 2:
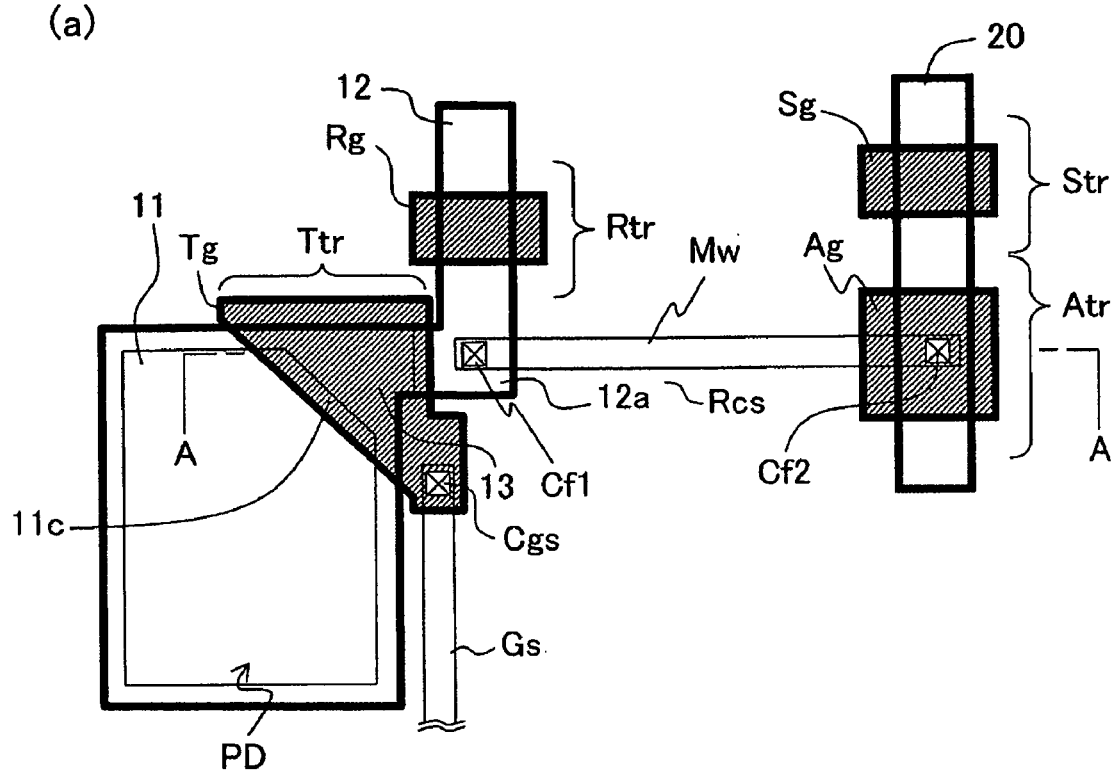
FIG. 2 is a diagram illustrating a structure of a pixel of a 4TR configuration.
Figure 2:
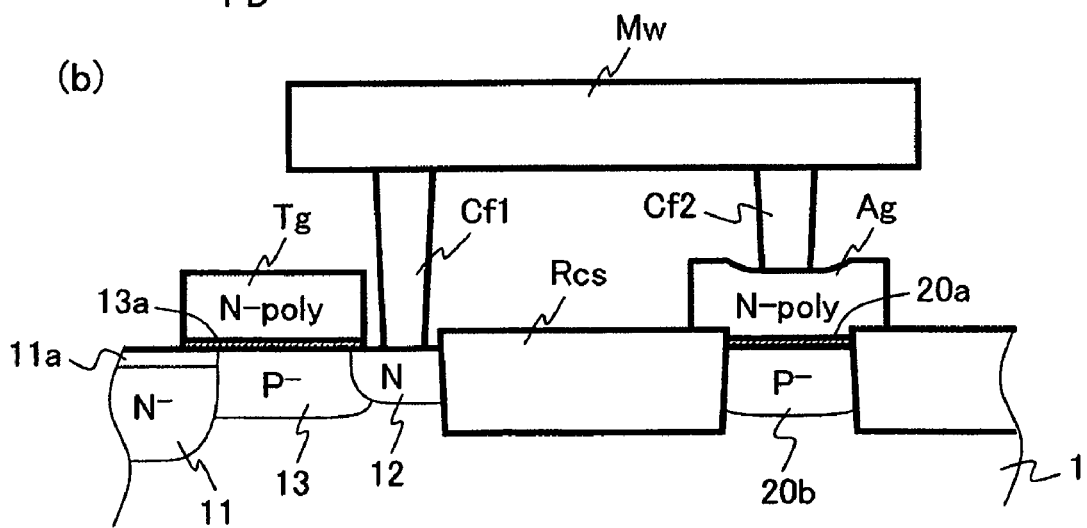

FIG. 2 is a diagram illustrating a structure of a pixel of a 4TR configuration. FIG. 2(a) illustrates the plan view layout and FIG. 2(b) illustrates a cross sectional structure along a line A-A.

In a predetermined area of a surface of a p-type semiconductor substrate 1, such as p-type silicon, an n⁻ type diffusion area 11 is formed, where then type diffusion area 11 configures a photodiode PD and is longitudinally oriented and is a substantially rectangular shaped. The diffusion area 11 has a shape with one of the corners cut off. In this portion 11c (referred to as a side edge inclined portion) with a cut off corner, a gate electrode (transfer gate electrode) Tg of a transfer transistor Ttr, which has a substantially right-angled isosceles triangle, is positioned therein in such a manner that the hypotenuse is parallel to a side edge of the side edge inclined portion of the rectangular diffusion area 11, and further, the gate electrode and the diffusion area 11 slightly overlap each other at the side edge inclined portion. Herein, a p-type diffusion layer 11a is formed on a surface portion of the n⁻ type diffusion area 11 such that the photodiode PD is a buried type photodiode.

In addition, a belt shaped diffusion area 12 is positioned near the side edge inclined portion 11c of the diffusion area 11, where the belt shaped diffusion area 12 is extended in a direction parallel to a long side of the substantially rectangular diffusion area 11 (longitudinal direction in the figure) and configures the reset transistor Rtr. A gate electrode Rg of the reset transistor is positioned at a middle portion of the diffusion area 12. In addition, one end side portion (lower side in the figure) of the belt shaped diffusion area 12 is positioned in such a manner to be close to the side edge inclined portion 11c of the diffusion area 11. A portion of the one end side portion slightly overlaps with the gate electrode at a longitudinal direction side edge portion of the transfer gate electrode Tg. In addition, at one end of the transfer gate electrode Tg, a transfer gate selection line Gs for applying a transfer signal TX to the gate electrode is connected through a contact hole Cgs.

Herein, the diffusion area 12, which configures the reset transistor Rtr, is an n-type diffusion area that is selectively formed on the p-type semiconductor substrate 1, and the one end side portion configures a floating diffusion area (FD area) 12a for accumulating a signal charge read out from the photodiode PD. In addition, a p-type diffusion area 13 is formed between the n⁻ type diffusion area 11 and the n-type diffusion area 12. The diffusion area 13 is a channel area of the transfer transistor Ttr described above, and the transfer gate Tg, which is formed of n-type polysilicon, is positioned thereabove through a gate insulation film 13a.

An n-type diffusion area 20, which is extended in a longitudinal direction in the figure and is belt shaped, is positioned above the semiconductor substrate 1 in such a manner to oppose to the belt shaped n-type diffusion area 12 that configures the reset transistor Rtr. Above a one end side portion (lower side in the figure) of the diffusion area 20, a gate electrode Ag is positioned through a gate insulation film 20a, where the gate electrode Ag configures the amplifying transistor Atr described above and is formed of n-type polysilicon. Above the other end side portion (upper side in the figure) of the diffusion area 20, a gate electrode Sg is positioned, where the gate electrode Sg configures the selection transistor Str described above. Herein, a p-type diffusion layer, which functions as a channel layer, is formed in an area on the lower side of a gate electrode of each transistor, of the n-type diffusion areas 12 and 20. For example, as illustrated in FIG. 2(b), a p⁻ type diffusion layer 20b is formed on the lower side portion of a gate electrode Ag of the n-type diffusion area 20.

The diffusion areas 11, 12, 13 and 20 described above are insulated and separated by an element separation area RCS, which is formed of an oxide film and the like that are formed above the semiconductor substrate 1.

The FD area 12a and the amplifying (source follower) transistor Atr are connected to each other by a metal wiring Mw. One end of the metal wiring Mw is connected to the FD area 12a through a contact hole Cf1, and the other end of the metal wiring Mw is connected to the gate electrode Ag through a contact hole Cf2.

Further, according to Embodiment 1, the gate areas of the reset transistor Rtr and the selection transistor Str that configure the pixel 110 are defined to be a minimal area determined by a driving ability that is required respectively. In addition, the gate area of the source follower transistor Atr, which configures the pixel 110, is defined to be larger than the gate areas of the reset transistor Rtr and the selection transistor Str described above.

According to Embodiment 1, in particular, the amplifying transistor (source follower transistor) Atr is formed in such a manner that the gate area is defined to be 135% or more of the maximum gate area of all the transistors Str and Ttr, with the exception of the transfer transistor Ttr, that configure the pixel 110.

However, it is desirable to set a channel width of the source follower transistor to be equal to other transistors in the pixel, except for the transfer transistor, so that pixels are arranged in an array without a space, and it is desirable to extend only a channel length of the source follower transistor.

Thus, according to Embodiment 1, of the four transistors Ttr, Rtr, Str and Atr that configure a pixel, the gate width (channel width) of the reset transistor Rtr, selection transistor Str, and amplifying transistor Atr are set to be equal with the exception of the transfer transistor Ttr, and the gate length (channel length) of the amplifying transistor Atr is set to be 135% or more of the maximum gate length of the reset transistor Rtr and selection transistor Str.

Although the gate areas of the reset transistor Rtr and the selection transistor Str are set to be equal according to the present embodiment, the gate areas of these transistors may be different from each other.

Next, a function and effect will be described.

According to the prior art, a gate insulation film of a transistor inside a pixel, which configures a solid-state image capturing apparatus, is formed in such a manner that at least a portion near a silicon interface is configured of an oxide that does not contain nitride, so that the random noise is reduced. However, depending on a semiconductor forming process to be used, the random noise reducing effect cannot be significantly observed. Further, because the film quality of the gate insulation film is required to change, various characteristics, including the reliability of the device, may change.

On the other hand, the solid-state image capturing apparatus 100 according to Embodiment 1 includes the gate area of the source follower transistor that is set to be larger than the gate area of other transistors inside a pixel with the exception of the transfer transistor. As a result, even if an electric charge is captured at a silicon/gate insulation film interface of the source follower transistor, an influenced area of a coulomb potential by the captured electric potential with respect to a channel area of the source follower transistor becomes relatively small, reducing the amount of the change of output characteristics. Thereby, the reduction of the noise level of the random noise can be achieved.

Figure 3:
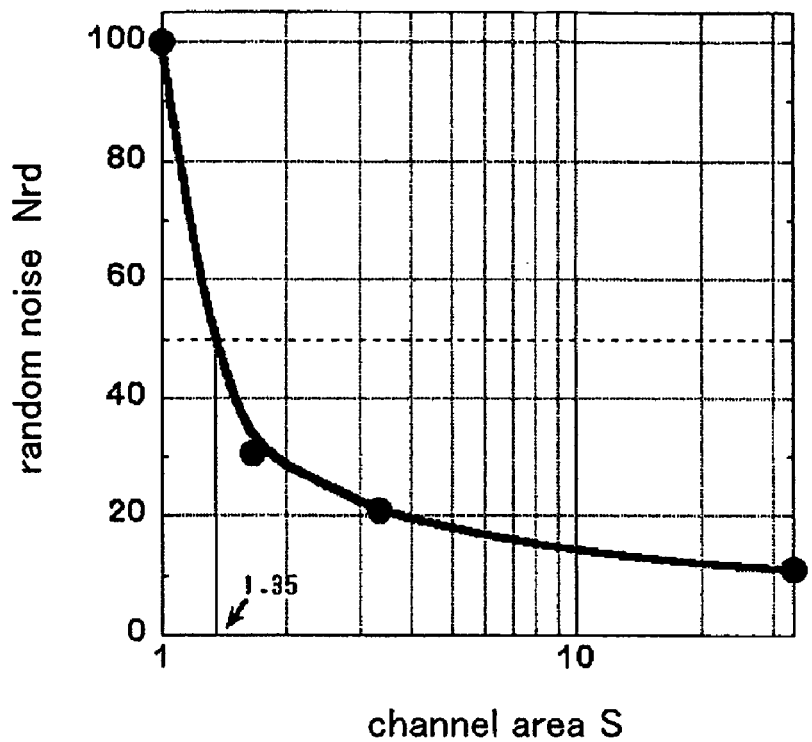
FIG. 3 is a diagram illustrating an effect of the solid-state image capturing apparatus according to Embodiment 1.
Figure 3:
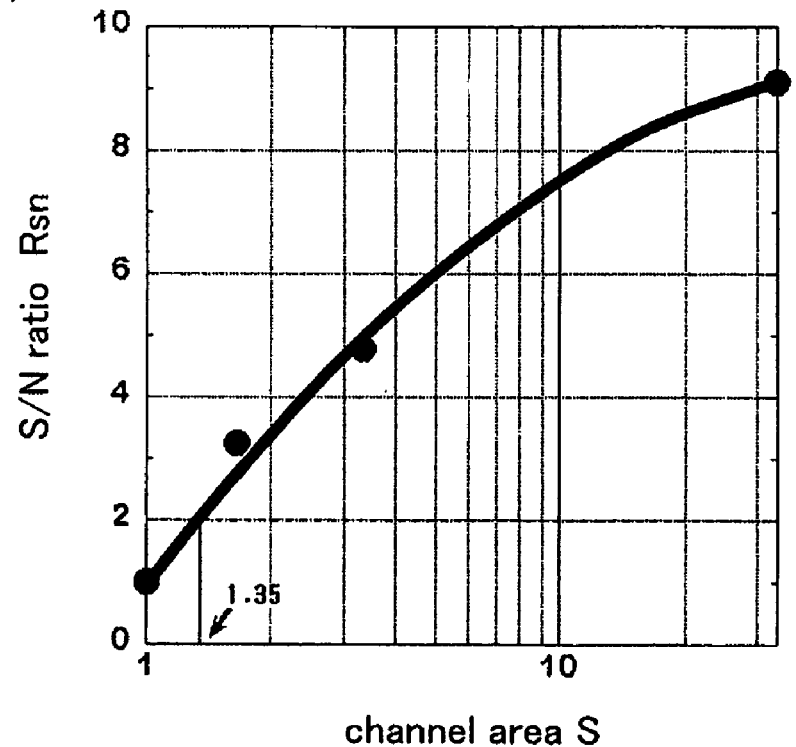

FIG. 3 is a diagram illustrating a reduction of a noise level. FIG. 3(a) illustrates a change of a random noise Nrd with a graph when a gate area (channel area) S of the source follower transistor is changed with respect to a gate area of the reset transistor Rtr and the selection transistor Str in the solid-state image capturing apparatus according to Embodiment 1. FIG. 3(b) illustrates a change of S/N ratio Rsn with a graph when a gate area (channel area) S of the source follower transistor is changed with respect to a gate area of the reset transistor Rtr and the selection transistor Str in the solid-state image capturing apparatus according to Embodiment 1.

As can be seen from the graphs, the random noise Nrd is reduced to half and the S/N ratio Rsn is doubled by setting the gate area (channel area) S of the source follower transistor to be 135% of the gate area of the reset transistor Rtr and the selection transistor Str.

Substantially, such a degree of noise reduction effect can be expected, and therefore, it is desirable the gate area of the source follower transistor set to be 135% or more of the maximum gate area of the transistors in each pixel with the exception of the transfer transistor.

Thus, according to Embodiment 1, the gate area of the source follower transistor Atr, which configures the pixel 110, is set to be larger than the gate area of the reset transistor Rtr and selection transistor Str described above, so that it is possible to provide a solid-state image capturing apparatus, including a CMOS image sensor, in which the influence of random noise can be reduced by a simple method, without depending on a semiconductor forming process to be used, and the influence of the random noise is sufficiently controlled.

Although the source follower transistor is an n-type MOS field-effect transistor and the gate electrode is configured with an n-type semiconductor (n-type polysilicon) in Embodiment 1, the gate electrode of the n-type source follower transistor may be configured with a p-type semiconductor (p-type polysilicon). In this case, in the source follower transistor, the p-type polysilicon gate electrode and the p-type channel area oppose with each other via the gate insulation film. This is different from the case of the source follower transistor of Embodiment 1 where the n-type polysilicon gate electrode and the p-type channel area oppose with each other via the gate insulation film. In this case (the gate electrode is configured with a p-type semiconductor), an energy structure where an electric charge is hard to be captured will be formed on the silicon/gate insulation film interface, which means that a channel current flows in an area that is away from the silicon/gate insulation film interface, thereby further reducing the random noise.

Further, the source follower transistor may be a p-type MOS field-effect transistor that includes a gate electrode configured with a p-type semiconductor (p-type polysilicon). In this case, in the source follower transistor the p-type polysilicon gate electrode and the n-type channel area oppose with each other via the gate insulation film and the channel current flows in a deeper portion of a substrate compared to the case where the p-type polysilicon gate electrode and the p-type channel area oppose with each other via the gate insulation film. As a result, a complete embedded channel structure of the source follower transistor where an electric charge is hardly ever to be captured can be formed on the silicon/gate insulation film interface, thereby still further reducing the random noise.

Further, according to Embodiment 1, the semiconductor substrate is defined to be a p-type conductive type. However, the semiconductor substrate may be an n-type conductivity type. In this case, the conductive type of the transistor formed on the semiconductor substrate may be an opposite conductive type from that of Embodiment 1 to obtain a solid-state image capturing apparatus (CMOS image sensor) similar to the solid-state image capturing apparatus according to Embodiment 1.

Further, according to Embodiment 1, although the pixel has a four transistor configuration that includes an amplifying transistor, a transfer transistor, a reset transistor and a selection transistor, the configuration of the pixel is not limited to this. For example, it may be a three transistor configuration, and a three transistor configuration of a pixel will be described hereinafter as Embodiment 2 of the present invention.

Embodiment 2

Figure 4:
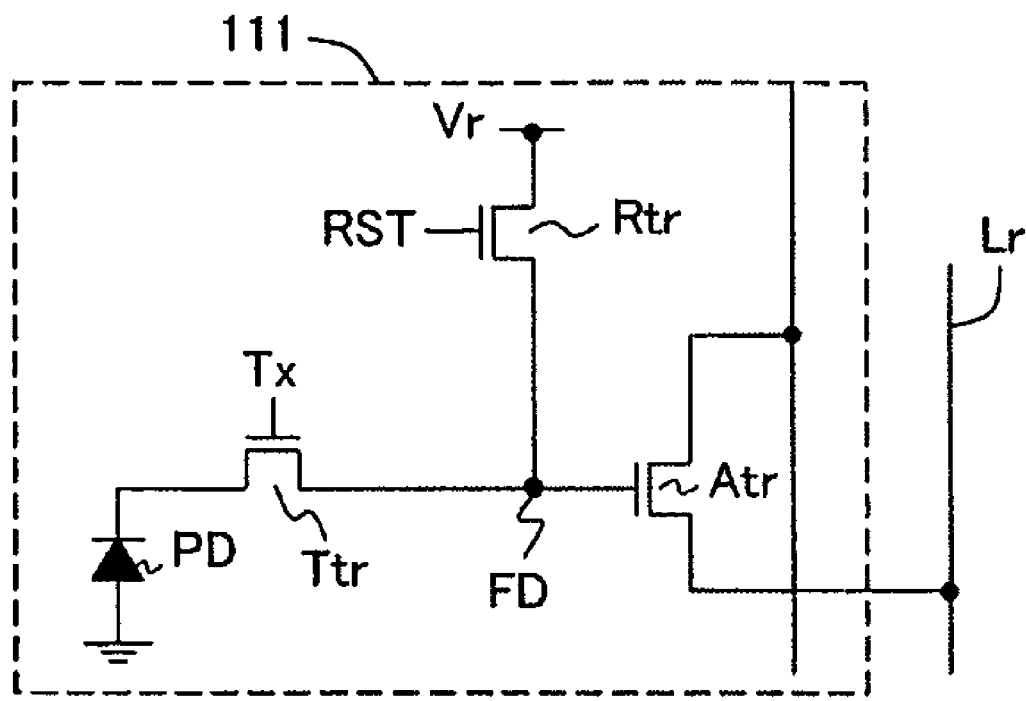
FIG. 4 is a diagram illustrating a solid-state image capturing apparatus according to Embodiment 2 of the present invention, where a circuit configuration of a pixel of a 3TR configuration is illustrated.

FIG. 4 is a diagram illustrating a solid-state image capturing apparatus according to Embodiment 2 of the present invention, where a circuit configuration of a pixel of a 3TR configuration is illustrated.

The solid-state image capturing apparatus of Embodiment 2 includes a pixel array where 3TR configuration pixels are arranged in a two dimension array. A pixel 111 of a 3TR configuration includes: a photodiode PD for performing a photoelectric conversion; a transfer transistor Ttr for transferring a signal charge generated at the photodiode PD to a signal charge accumulating section FD by a transfer signal Tx; an amplifying transistor (source follower transistor) Atr for amplifying a level of the signal charge transferred to the signal charge accumulating section FD to generate a corresponding signal voltage; and a reset transistor Rtr for resetting the signal charge accumulating section FD to a power source voltage Vd by a reset signal RST. According to such a pixel of a 3TR configuration, when a particular pixel is selected in a selected pixel column in a state where such one pixel column has been selected in a pixel array, gate electrodes of reset transistors of all of the non-selected pixels, other than the selected pixel, are applied with voltage that will not turn on amplifying transistors of the non-selected pixels, so that only a pixel signal of the particular pixel is read out to a readout line Lr.

Further in such a pixel of a 3TR configuration, the gate area of the source follower transistor Atr, which configures the pixel 111, is set to be larger than the gate area of another transistor in a pixel, namely the reset transistor Rtr, with the exception of the transfer transistor Ttr described above.

Further in the solid-state image capturing apparatus according to Embodiment 2 with the structure described above, the gate area of the source follower transistor Atr, which configures the pixel 111, is set to be larger than the gate area of the reset transistor Rtr in the pixel, with the exception of the transfer transistor Ttr described above, so that it is possible to provide a solid-state image capturing apparatus, including a CMOS image sensor, as similar to Embodiment 1, in which the influence of random noise can be reduced by a simple method, without depending on a semiconductor forming process to be used, and the influence of the random noise is sufficiently controlled.

According to Embodiment 1, the pixel array includes a structure where a reset transistor, an amplifying transistor, and a selection transistor are provided for each pixel. According to Embodiment 2, the pixel array includes a structure where a reset transistor and an amplifying transistor are provided for each pixel. However, the reset transistor and the amplifying transistor may be shared by adjusting pixels, and a structure where a plurality of pixels share a certain transistor in a pixel will be described as Embodiments 3 and 4 of the present invention.

Embodiment 3

Figure 5:
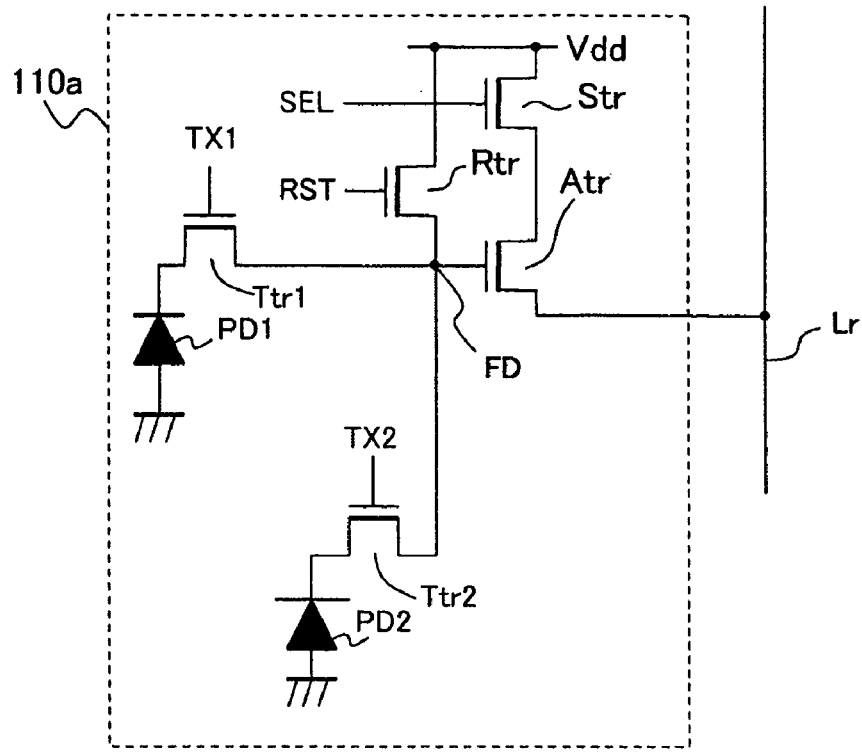
FIG. 5 is a diagram illustrating a solid-state image capturing apparatus according to Embodiment 3 of the present invention.
Figure 5:
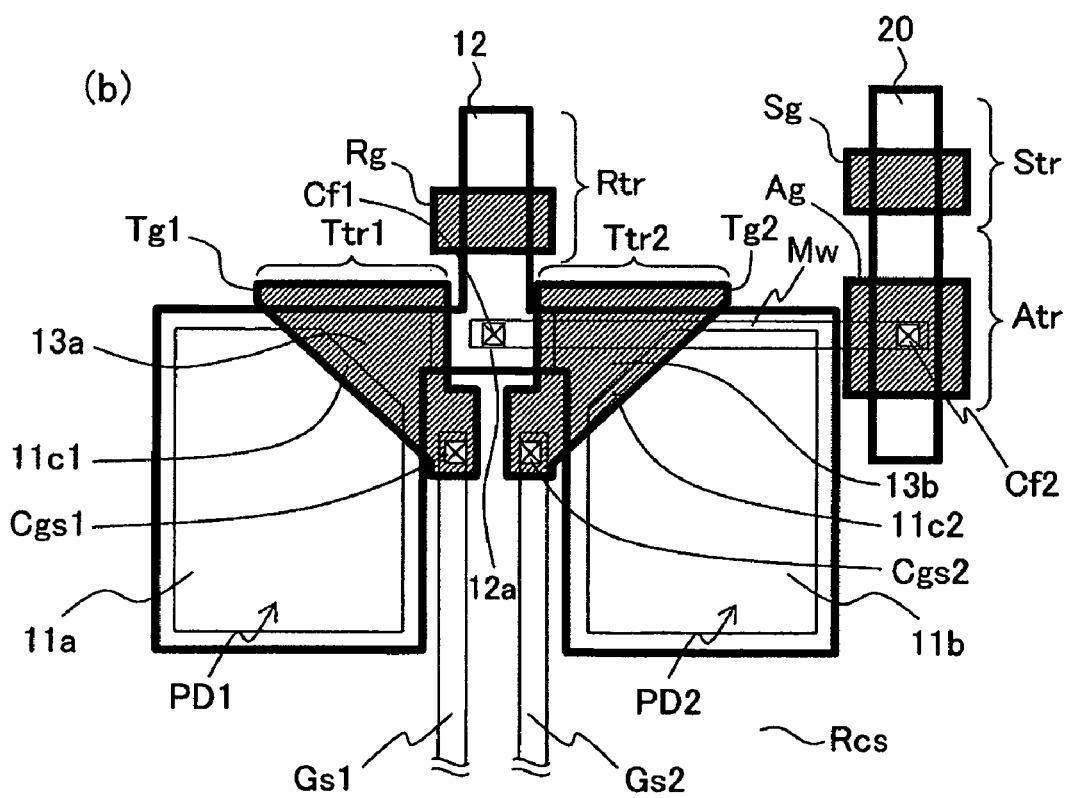

FIG. 5 is a diagram illustrating a solid-state image capturing apparatus according to Embodiment 3 of the present invention. FIG. 5(a) illustrates a circuit configuration of the pixel.

A pixel circuit 110a of the present embodiment includes a circuit configuration where two adjacent pixels according to Embodiment 1 share a reset transistor Rtr, a selection transistor Str and an amplifying transistor Atr.

That is, according to the pixel circuit 110a of Embodiment 3 that is shared by two pixels, a photodiode PD1, a transfer transistor Ttr1, a reset transistor Rtr, a selection transistor Str and an amplifying transistor Atr configure one of the pixels and a photodiode PD2, a transfer transistor Ttr2, the reset transistor Rtr, the selection transistor Str and the amplifying transistor (source follower transistor) Atr configure the other pixel.

Similar to the photodiode PD in Embodiment 1, the photodiodes PD1 and PD2 herein generate a signal charge by a photoelectric conversion of an incident light, and the transfer transistors Trt1 and Trt2 transfer a signal charge generated at the photodiodes PD1 and PD2 respectively to a gate electrode of the amplifying transistor Atr by transfer signals TX1 and TX2. Further, the reset transistor Rtr discharges a signal charge accumulated in each gate electrode of the transfer transistors Ttr1 and Ttr2 by the reset signal RST; the amplifying transistor Atr amplifies a signal charge generated at the photodiodes PD1 and PD2 to generate a signal voltage; and the selection transistor Str is connected between a drain of the amplifying transistor and a power source line Vdd and applies a power source voltage to the amplifying transistor by the selection signal SEL to turn two pixels that share the transistors into a selectable state. However, two pixels are simultaneously selected by the selection transistor Str here, and therefore, the selection of one or the other of the two pixels that are selected by the selection transistor Str is performed by switching an operation timing of the transfer transistors Ttr1 and Ttr2.

FIG. 5(b) is a diagram illustrating a plan view layout of a pixel circuit of a 4TR configuration in which two pixels share a portion of transistors in a pixel.

In a predetermined area of a surface of a p-type semiconductor substrate 1, such as p-type silicon, a pair of longitudinally oriented and substantially rectangular shaped n⁻ type diffusion areas 11a and 11b are positioned in an adjacent manner to each other, where each of the n⁻ type diffusion areas configures a photodiode PD1 and PD2 respectively. The diffusion areas 11a and 11b have a shape with one of the corners cut off. In each of these portions 11a and 11b (referred to as a side edge inclined portion) with a cut off corner, gate electrodes (transfer gate electrodes) Tg1 and Tg2 of respective transfer transistors Ttr1 and Ttr2, which have a substantially rectangular equilateral triangle, are positioned in such a manner that the hypotenuse is parallel to a side edge of the side edge inclined portion of the rectangular diffusion are as 11a and 11b, and further, the gate electrode and the diffusion area slightly overlap each other at the side edge inclined portion.

In addition, a belt shaped diffusion area 12 is positioned between a side edge inclined portion 11c1 of the diffusion area 11a and a side edge inclined portion 11c2 of the diffusion area 11b, where the belt shaped diffusion area 12 is extended in a direction parallel to a long side of the substantially rectangular diffusion areas 11a and 11b (longitudinal direction in the figure) and configures the reset transistor Rtr. The diffusion area 12 is identical to that of Embodiment 1, and a gate electrode Rg of the reset transistor is positioned at a middle portion of the diffusion area 12. In addition, one end side portion (lower side in the figure) of the belt shaped diffusion area 12 is positioned in such a manner to be close to the side edge inclined portions 11c1 and 11c2 of the diffusion areas 11a and 11b. A portion of the one end side portion slightly overlaps with the gate electrode of the transfer gates electrodes Tg1 and Tg2 at a longitudinal direction side edge portion of the transfer gate electrodes Tg1 and Tg2.

In addition, at one end of the transfer gate electrodes Tg1 and Tg2 described above, transfer gate selection lines Gs1 and Gs2 for applying respective transfer signals TX1 and TX2 to the gate electrodes are connected through contact holes Cgs1 and Cgs2.

In other words, the photodiode PD1, diffusion area 11a, transfer gate Tg1, and transfer gate selection line Gs1 in Embodiment 3 have the same configuration as that of Embodiment 1. In addition, the photodiode PD2, diffusion area 112, transfer gate Tg2, and transfer gate selection line Gs2 in Embodiment 3 have a symmetrical layout about the photodiode PD, diffusion area 11, transfer gate Tg, and transfer gate selection line Gs in Embodiment 1 with the diffusion area 12 as an axis of symmetry.

Further in Embodiment 3, the diffusion area 12 that configures the reset transistor Rtr is an n-type diffusion area that is selectively formed on the p-type semiconductor substrate (see FIG. 2(b)), and the one end side portion configures a floating diffusion area (FD area) 12a for accumulating a signal charge read out from the photodiode PD. In addition, p-type diffusion areas 13a and 13b are formed between the n⁻ type diffusion areas 11a and 11b and the n-type diffusion area 12. The diffusion areas 13a and 13b are channel areas of the transfer transistors Ttr1 and Ttr2 described above, and the transfer gates Tg1 and Tg2, which are formed of n-type polysilicon, are positioned thereabove through a gate insulation film.

In addition, an n-type diffusion area 20, which is extended in a longitudinal direction in the figure, and is belt shaped, is positioned above the semiconductor substrate 1 as similar to Embodiment 1, in such a manner to oppose to the belt shaped n-type diffusion area 12 that configures the reset transistor Rtr. Above one end side portion (lower side in the figure) of the diffusion area 20, a gate electrode Ag is positioned through a gate insulation film, where the gate electrode Ag configures the amplifying transistor Atr described above and is formed of n-type polysilicon. Above the other end side portion (upper side in the figure) of the diffusion area, a gate electrode Sg is positioned, where the gate electrode Sg configures the selection transistor Str described above.

The diffusion areas 11a, 11b, 12, 13a, 13b and 20 described above are insulated and separated by an element separation area Rcs, which is formed of an oxide film and the like that are formed above the semiconductor substrate 1.

In addition, the FD area 12a and the source follower transistor Atr are connected to each other by a metal wiring Mw. One end of the metal wiring Mw is connected to the FD area 12a through a contact hole Cf1, and the other end of the metal wiring Mw is connected to the gate electrode Ag through a contact hole Cf2.

Further, according to Embodiment 3, the gate areas of the reset transistor Rtr and the selection transistor Str in the pixel 110a are defined to be a minimal area determined by a driving ability that is required respectively. In addition, the gate area of the source follower transistor Atr is defined to be larger than the gate areas of the reset transistor Rtr and the selection transistor Str described above.

More specifically, the amplifying transistor (source follower transistor) Atr in Embodiment 3 is formed in such a manner that the gate area is defined to be 135% or more of the maximum gate area of all the transistors Str and Ttr, with the exception of the transfer transistor Ttr, that configure the pixel.

Further, it is desirable in Embodiment 3 to set a channel width of the source follower transistor to be equal to other transistors in the pixel, except for the transfer transistor, so that pixels are arranged in an array without a space, and it is desirable to extend only a channel length of the source follower transistor. Therefore, of the four transistors Ttr1, Ttr2, Rtr, Str and Atr in a pixel circuit in which two pixels share, the gate width (channel width) of the reset transistor Rtr, selection transistor Str, and amplifying transistor Atr are set to be equal with the exception of the transfer transistor Ttr, and the gate length (channel length) of the amplifying transistor Atr is set to be 135% or more of the maximum gate length of the reset transistor Rtr and selection transistor Str.

Thus, according to Embodiment 3, the amplifying transistor Atr is formed in such a manner that the gate area is defined to be 135% or more of the maximum gate area of other transistors, with the exception of the transfer transistors Ttr1 and Ttr2, that configure the pixel, thereby reducing the influence of the random noise by a simple change of the layout pattern, without depending on a semiconductor forming process to be used.

In addition, a plurality of adjacent pixels have a circuit configuration to share the reset transistor, thereby reducing an area occupied by the pixels.

According to Embodiment 3, although the gate areas of the reset transistor Rtr and the selection transistor Str are identical in size, the gate areas of the respective transistors may be different from each other.

In addition, according to Embodiment 3, although each pixel in the pixel circuit that two pixels share has a four transistor configuration that includes an amplifying transistor, a transfer transistor, a reset transistor and a selection transistor, the configuration of the pixel is not limited to this even in the pixel circuit that two pixels share. For example, it may be a three transistor configuration, and a three transistor configuration of a pixel in the pixel circuit that two pixels share will be described hereinafter as Embodiment 4 of the present invention.

Embodiment 4

Figure 6:
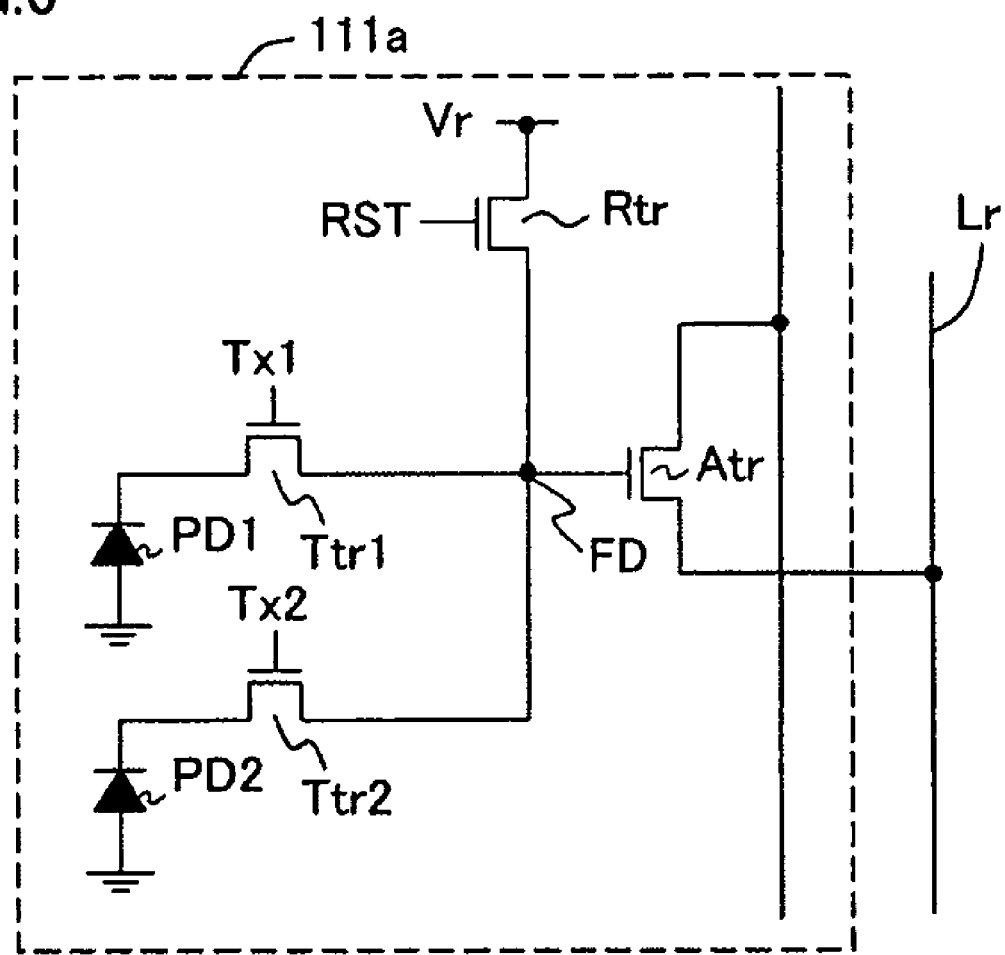
FIG. 6 is a diagram illustrating a solid-state image capturing apparatus according to Embodiment 4 of the present invention, where a circuit configuration of a pixel of a 3TR configuration is illustrated in a pixel circuit that two pixels share.

FIG. 6 is a diagram illustrating a solid-state image capturing apparatus according to Embodiment 4 of the present invention, where a circuit configuration of a pixel of a 3TR configuration is illustrated in a pixel circuit that two pixels share.

That is, according to the pixel circuit 111a of Embodiment 4 that is shared by two pixels, a photodiode PD1, a transfer transistor Ttr1, a reset transistor Rtr, and an amplifying transistor (source follower transistor) Atr configure one of the pixels, and a photodiode PD2, a transfer transistor Ttr2, the reset transistor Rtr, and the amplifying transistor Atr configure the other pixel.

Similar to the photodiode PD in Embodiment 3, the photodiodes PD1 and PD2 herein generate a signal charge by a photoelectric conversion of an incident light, and the transfer transistors Trt1 and Trt2 transfer a signal charge generated at the photodiodes PD1 and PD2 respectively to a gate electrode of the amplifying transistor Atr by transfer signals TX1 and TX2. Further, the reset transistor Rtr discharges a signal charge accumulated in each gate electrode of the transfer transistors Ttr1 and Ttr2 by the reset signal RST; and the amplifying transistor Atr amplifies a signal charge generated at the photodiodes PD1 and PD2 to generate a signal voltage. In Embodiment 4, the pixel is a 3TR configuration pixel and does not include a selection transistor. Therefore, when a particular pixel is selected in a selected pixel column in a state where such one pixel column has been selected in a pixel array, gate electrodes of reset transistors of all of the non-selected pixels, other than the selected pixel, are applied with voltage that will not turn on amplifying transistors of the non-selected pixels, so that only a pixel signal of the particular pixel is read out to a readout line Lr.

In addition, according to Embodiment 4, the gate area of the reset transistor Rtr in the pixel circuit 111a is defined to be a minimal area determined by a driving ability that is required. In addition, the gate area of the source follower transistor Atr is defined to be larger than the gate areas of the reset transistor Rtr described above.

More specifically, the amplifying transistor (source follower transistor) Atr in Embodiment 4 is formed in such a manner that the gate area is defined to be 135% or more of the maximum gate area of other transistor Rtr, with the exception of the transfer transistor Ttr, that configure the pixel.

Further, it is desirable in Embodiment 4, as well, to set a channel width of the source follower transistor to be equal to other transistors in the pixel, except for the transfer transistor, so that pixels are arranged in an array without a space, and it is desirable to extend only a channel length of the source follower transistor. Therefore, of the four transistors Ttr1, Ttr2, Rtr, Str and Atr in a pixel circuit in which two pixels share, the gate width (channel width) of the reset transistor Rtr, selection transistor Str, and amplifying transistor Atr are set to be equal with the exception of the transfer transistors Ttr1 and Ttr2, and the gate length (channel length) of the amplifying transistor Atr is set to be 135% or more of the maximum gate length of the reset transistor Rtr and selection transistor Str.

Further in the solid-state image capturing apparatus according to Embodiment 4 with the configuration described above, the gate area of the source follower transistor Atr, which configures the pixel circuit 111 that is shared by two pixels, is set to be larger than the gate area of the reset transistor Rtr described above, so that it is possible, as similar to Embodiment 1 described above, to provide a solid-state image capturing apparatus, including a CMOS image sensor, in which the influence of random noise can be reduced by a simple method, without depending on a semiconductor forming process to be used.

In addition, a plurality of adjacent pixels have a circuit configuration to share the reset transistor, thereby reducing an area occupied by the pixels.

The circuit configuration that configures the pixel described above is not limited to the configuration described above. For example, the pixel that configures a solid-state image capturing apparatus may be a pixel that does not include a transfer transistor, and such a solid-state image capturing apparatus will be described hereinafter as Embodiment 5.

Embodiment 5

Figure 7:
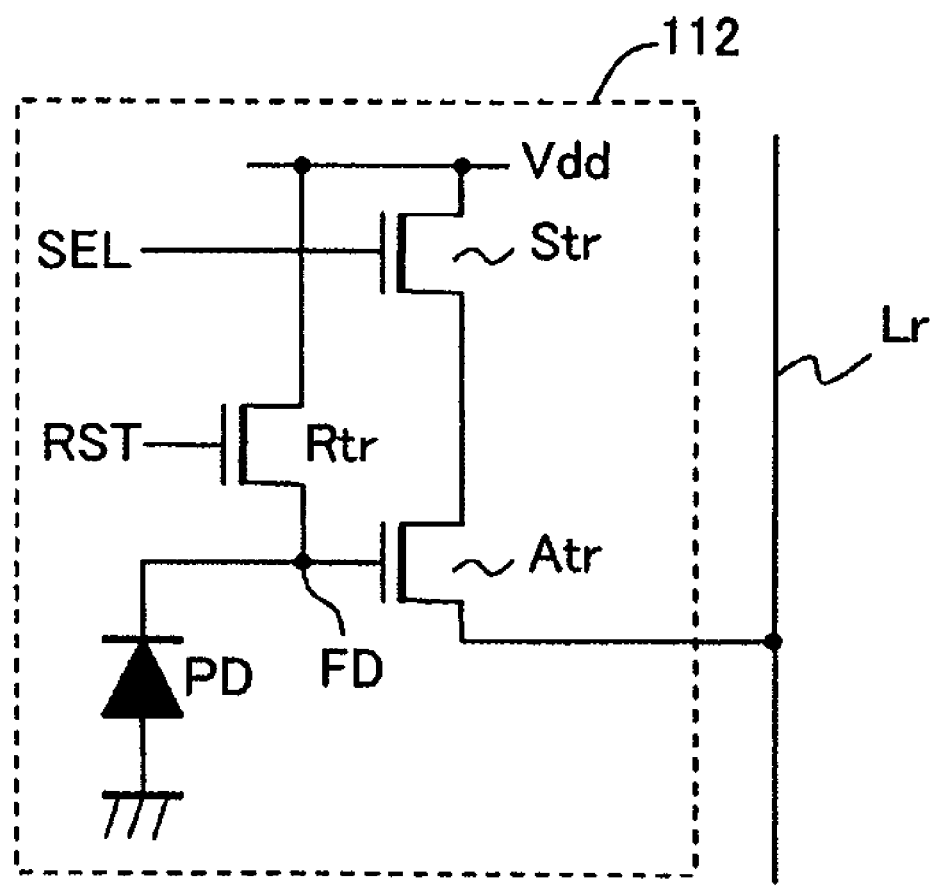
FIG. 7 is a diagram illustrating a solid-state image capturing apparatus according to Embodiment 5 of the present invention, where a circuit configuration of a pixel of a 3TR configuration that does not include a transfer transistor is illustrated.

FIG. 7 is a diagram illustrating a solid-state image capturing apparatus according to Embodiment 5 of the present invention, where a circuit configuration of a pixel of a 3TR configuration that does not include a transfer transistor is illustrated.

The solid-state image capturing apparatus according to Embodiment 5 includes a pixel array in which pixels 112 of a 3TR configuration are arranged in two dimensional array. The pixel 112 of a 3TR configuration includes: a photodiode PD for performing a photoelectric conversion; an amplifying transistor Atr that includes a gate electrode for inputting a signal charge generated at the photodiode PD and generates a signal voltage that corresponds to a signal charge accumulated in the gate electrode; a selection transistor Str connected between a drain of the amplifying transistor and a power source line Vdd, for applying a power source voltage to the amplifying transistor by a selection signal SEL; and a reset transistor Rtr for resetting a signal charge accumulation section (gate electrode of the amplifying transistor) FD to the power source voltage Vdd by a reset signal RST.

Further in such a pixel of a 3TR configuration, the gate area of the source follower transistor Atr, which configures the pixel 112, is set to be larger than the gate areas of the reset transistor Rtr and the selection transistor Str described above.

Further in the solid-state image capturing apparatus according to Embodiment 5 with the configuration described above, the gate area of the source follower transistor Atr, which configures the pixel circuit 112, is set to be larger than the gate areas of other reset transistor Rtr and selection transistor Str described above, so that it is possible, as similar to Embodiment 1 described above, to provide a solid-state image capturing apparatus, including a CMOS image sensor, in which the influence of random noise can be reduced by a simple method, without depending on a semiconductor forming process to be used.

Embodiment 6

Although not specifically described in Embodiments 1 to 5 described above, an electronic information device, such as a digital camera (e.g., a digital video camera and a digital still camera), an image input camera, a scanner, a facsimile machine, and a camera-equipped cell phone device, including at least the solid-state image capturing apparatus according to any of Embodiment 1 to 5 as an image input device used in an image capturing section of the electronic information device will be described herein as Embodiment 6 of the present invention.

Figure 8:
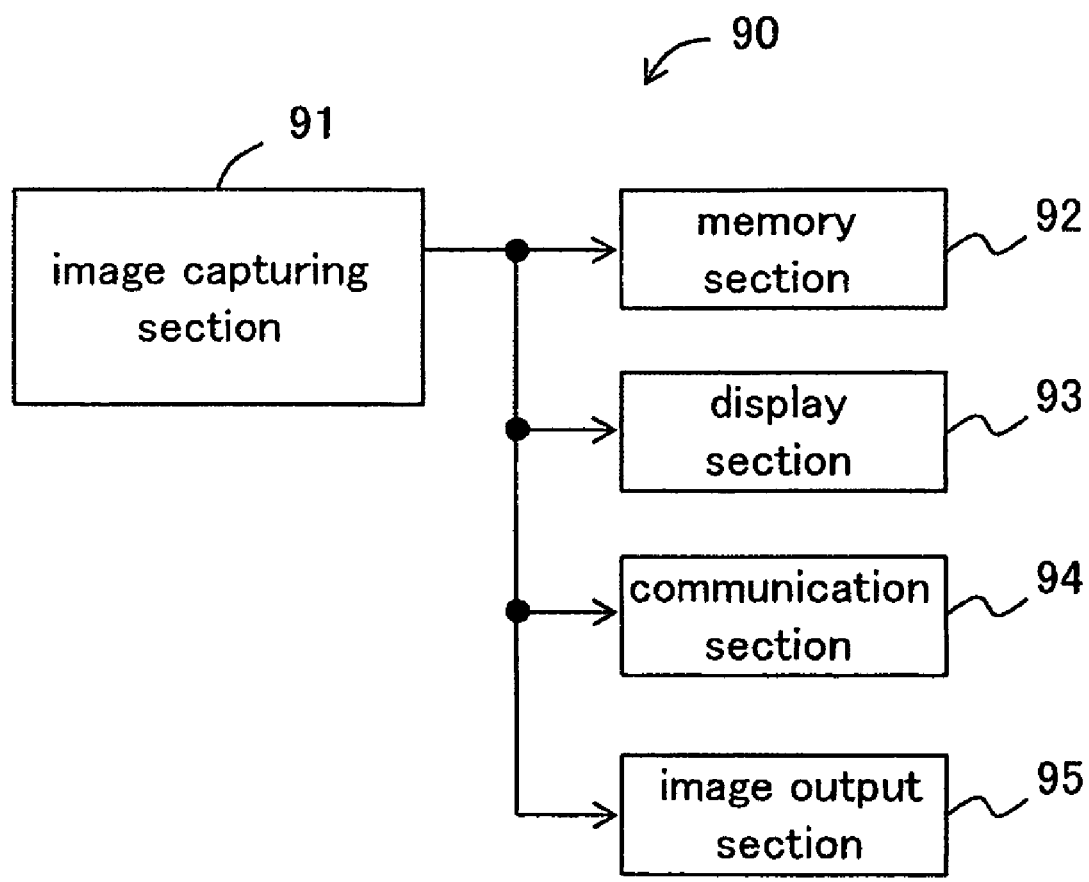
FIG. 8 is a block diagram illustrating an exemplary diagrammatic structure of an electronic information device of Embodiment 6 of the present invention, using a solid-state image capturing apparatus according to any of Embodiments 1 to 5 of the present invention in an image capturing section.

FIG. 8 is a block diagram illustrating an exemplary diagrammatic structure of an electronic information device of Embodiment 6 of the present invention, using a solid-state image capturing apparatus according to any of Embodiments 1 to 5 of the present invention in an image capturing section.

The electronic information device 90 according to Embodiment 6 of the present invention, as illustrated in FIG. 8, includes the solid-state image capturing apparatus according to any of Embodiments 1 to 5 of the present invention as an image capturing section 91 for capturing an image of a subject, and the electronic information device 90 further includes at least any of: a memory section 92 (e.g., recording media) for data-recording a high-quality image data obtained by using at least any of the solid-state image capturing apparatuses according to Embodiments 1 to 5 in an image capturing section, after a predetermined signal process is performed on the image data for recording; a display section 93 (e.g., liquid crystal display device) for displaying this image data on a display screen (e.g., liquid crystal display screen) after a predetermined signal process is performed for display; a communication section 94 (e.g., transmitting and receiving device) for communicating this image data after a predetermined signal process is performed on the image data for communication; and an image output section 95 for printing (typing out) and outputting (printing out) this image data.

As described above, the present invention is exemplified by the use of its preferred Embodiments 1 to 6. However, the present invention should not be interpreted solely based on Embodiments 1 to 6 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 to 6 of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can be applied in the field of a solid-state image capturing apparatus and an electronic information device, and more particularly to a solid-state image capturing apparatus, such as a CMOS image sensor, configured with semiconductor elements, for performing a photoelectric conversion on and capturing an image light from a subject; and an electronic information device including the solid-state image capturing apparatus as an image input device used in an image capturing section thereof. According to the present invention, the gate area of the amplifying transistor, which configures a pixel, is configured to be larger than a gate area of other transistors that configure the pixel, thereby reducing the influence of random noise by a simple change of the layout pattern, without depending on a semiconductor forming process to be used.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state image capturing apparatus comprising a pixel array in which a plurality of pixels are arranged in a matrix, wherein each of the pixels includes:
   a photodiode for obtaining a signal charge by a photoelectric conversion of an incident light, a selection transistor for selecting a pixel that the selection transistor configures from the plurality of pixels that configure the pixel array, an amplifying transistor for amplifying the signal charge obtained at the photodiode, a transfer transistor for transferring the signal charge obtained at the photodiode to a gate electrode of the amplifying transistor, and a reset transistor for discharging the signal charge obtained at the photodiode,
   wherein the amplifying transistor is configured in such a manner that a gate area of the amplifying transistor is defined to be larger than a gate area of the other transistors that configure the pixel with the exception of the transfer transistor;
   the selection transistor is located in the same active area as that of the amplifying transistor, and a gate area of the selection transistor is defined to be equal to a gate area of the reset transistor or to be smaller than the gate area of the reset transistor; and
   the pixel array is configured in such a manner that a plurality of two adjacent pixels share the reset transistor, and the gate area of the reset transistor is defined to be an area of a region in which a gate electrode and a channel area of the gate electrode in the reset transistor are overlapped.

2. A solid-state image capturing apparatus according to claim 1, wherein the pixel array is configured in such a manner that the plurality of two adjacent pixels share the selection transistor, and that a certain pixel in the plurality of two adjacent pixels is selected by the selection transistor and the transfer transistor of each pixel.

3. A solid-state image capturing apparatus according to claim 1, wherein the pixel is a pixel of a 4 transistor configuration that includes the amplifying transistor, the transfer transistor, the reset transistor and the selection transistor.

4. A solid-state image capturing apparatus according to claim 3, wherein the pixel array is configured in such a manner that the plurality of two adjacent pixels share the reset transistor and the selection transistor.

5. A solid-state image capturing apparatus according to claim 1, wherein the amplifying transistor is a source follower transistor that operates as a source follower circuit.

6. A solid-state image capturing apparatus according to claim 5, wherein a gate area of the source follower transistor is 135% or more of a gate area of the other transistors that configure the pixel with the exception of the transfer transistor.

7. A solid-state image capturing apparatus according to claim 5, wherein a channel length of the source follower transistor is 135% or more of a maximum channel length of the other transistors that configure the pixel with the exception of the transfer transistor.

8. A solid-state image capturing apparatus according to claim 5, wherein the source follower transistor is a second conductive type MOS field-effect transistor that includes a gate electrode that is configured of a first conductive type semiconductor.

9. A solid-state image capturing apparatus according to claim 5, wherein the source follower transistor is a first conductive type MOS field-effect transistor that includes a gate electrode that is configured of a first conductive type semiconductor.

10. An electronic information device comprising an image capturing section for capturing an image of a subject, wherein the image capturing section is the solid-state image capturing apparatus according to any one of claims 1 to 9.

* * * * *